United States Patent
Lin et al.

(10) Patent No.: US 6,803,654 B1
(45) Date of Patent: Oct. 12, 2004

(54) HEAT-RADIATING DEVICE OF CHIP

(75) Inventors: Ming-Chen Lin, Keelung (TW); Tzung-Lung Lee, Taipei Hsien (TW)

(73) Assignee: Advanced Thermal Technologies, Taipei Hsien (TW)

( * ) Notice: Subject to any disclaimer, the term of this patent is extended or adjusted under 35 U.S.C. 154(b) by 0 days.

(21) Appl. No.: 10/602,769

(22) Filed: Jun. 25, 2003

(51) Int. Cl.⁷ .......................... H01L 23/10; H01L 23/34
(52) U.S. Cl. ...................... 257/707; 257/675; 257/706; 257/719
(58) Field of Search ................................ 257/675, 706, 257/707, 719, 720

(56) References Cited

U.S. PATENT DOCUMENTS

| 6,400,014 B1 * | 6/2002 | Huang et al. ................ 257/712 |
| 2003/0067070 A1 * | 4/2003 | Kwon et al. ................ 257/706 |

* cited by examiner

Primary Examiner—Ngân V. Ngô
(74) Attorney, Agent, or Firm—Browdy and Neimark P.L.L.C.

(57) ABSTRACT

A heat-radiating structure of chip provides effective heat-radiating paths and also maintains good structural stability to protect chips. A bearing rack is connected beside a flip chip type chip on a circuit substrate. The bearing rack is connected with a heat-radiating sheet. A projective portion is disposed at the center of the heat-radiating sheet facing the chip. The surfaces of the projective portion and the chip are connected together through adhesive. Several grooves are disposed on the surface of the heat-radiating sheet facing the chip to reduce the weight of the heat-radiating sheet and maintain its structural rigidity. Each side of the bearing rack is not connected together to avoid regions with a too large local thermal stress. Moreover, heat-spreading paths for hot, air are also provided to prevent the heat-radiating sheet from extra stress due to hot expansion and cold shrinkage during baking in the packaging process.

20 Claims, 13 Drawing Sheets

HEAT-RADIATING DEVICE OF CHIP

FIELD OF THE INVENTION

The present invention relates to a heat-radiating structure of chip, which applies to flip chip package structures to have better heat-radiating paths. Moreover, the stability of the heat-radiating structure can be enhanced, and local concentration of stress and damage caused by aging and fatigue can be reduced.

BACKGROUND OF THE INVENTION

Figure 1:
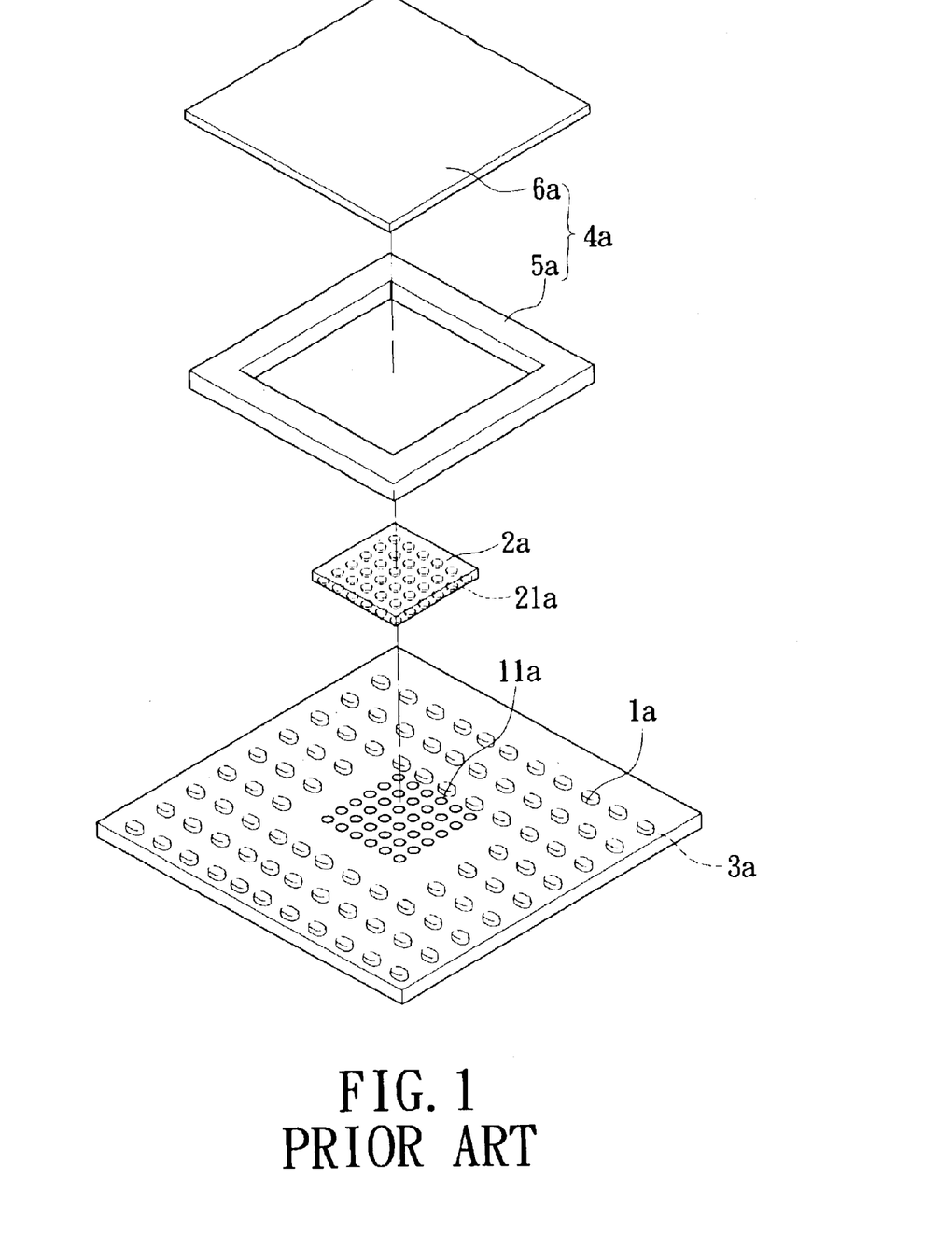
FIG. 1 is an exploded perspective view of a conventional heat-radiating structure of chip.
Figure 2:
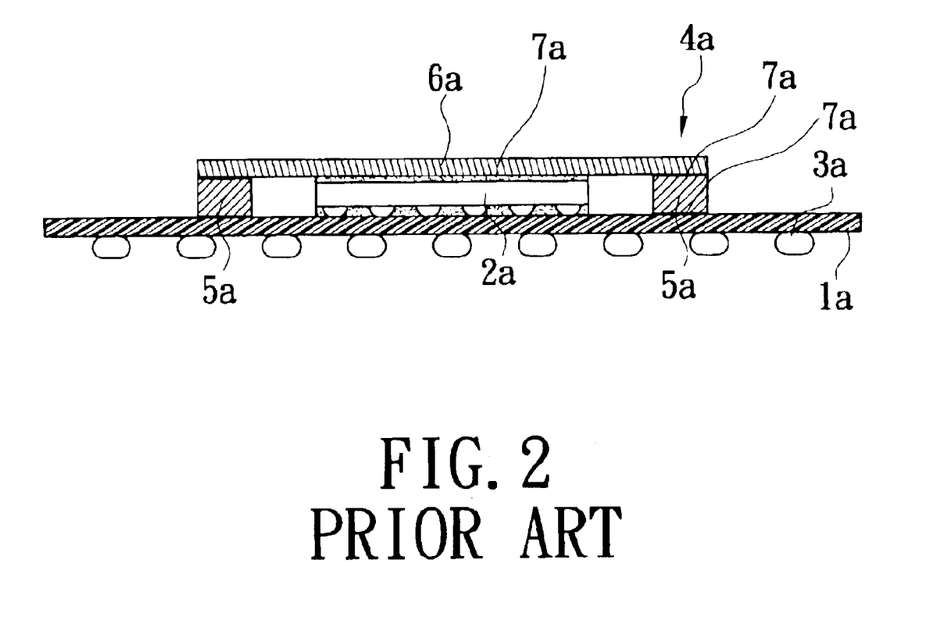
FIG. 2 is a cross-sectional view of a conventional heat-radiating structure of chip.

As shown in FIGS. 1 and 2, a conventional heat-radiating structure of chip comprises a circuit substrate 1a. A chip 2a of flip chip structure is connected on the circuit substrate 1a. An array of several solder balls 21a are disposed at the bottom face of the chip 2a to form a contact face. Ball sockets 11a are correspondingly disposed at the top face of the circuit substrate 1a so that part of each solder ball 21a can be connected at a corresponding ball socket 11a. A structure for electronic signal transmission with other circuit boards is disposed at the bottom face of the circuit substrate 1a. This structure is a ball grid array 3a in FIG. 1, and can also be a pin grid array. In addition to electronic signal transmission, the ball grid array 3a can also provide a heat-spreading path for the working chip 2a.

However, along with increase of the operating power of the chip 2a, more heat is generated per unit time so that simply the heat-spreading path of the ball grid array 3a is not sufficient. Therefore, the temperature of the chip 2a itself becomes higher and higher, hence affecting the working performance of the chip or even damaging the chip.

Accordingly, a heat-radiating component 4a is further disposed on the chip 2a. The heat-radiating component 4a comprises a high frame 5a and a heat-radiating plate 6a. The high frame 5a provides support to the heat-radiating plate 6a on the circuit substrate 1a. The heat-radiating plate 6a adheres to the high frame 5a and the surface of the chip 2a through an adhesive 7a (as shown in FIG. 2). The high frame 5a also adheres to the circuit substrate 1a through the adhesive 7a.

Although the conventional heat-radiating component, provides a good heat-spreading area and a certain degree of protection for the chip, it is of a two-piece design so that more cost is required in assembly steps and time and the use quantity of adhesive.

Besides, due to temperature rise when the chip operates and temperature drop when the chip stops operating, local concentration of stress and aging and fatigue at the adhesive regions will occur because of thermal cycle loading and difference between thermal expansion coefficients of different materials, hence causing local damage to result in falling off of the heat-radiating component from the chip.

Accordingly, the above heat-radiating structures of chip have inconvenience and drawbacks in practical use. The present invention aims to resolve the problems in the prior art.

SUMMARY OF THE INVENTION

The primary object of the present invention is to provide a heat-radiating structure of chip having an integrally formed heat-radiating component. The heat-radiating structure of chip can provide a good structural rigidity and stability, decrease thermal stress damage caused by thermal deformation, and reduce local concentration of stress and damage caused by aging and fatigue.

Another object of the present invention is to provide a heat-radiating structure of chip having a separately disposed bearing rack. The bearing rack forms an intermittent structure to avoid positions with a too large local thermal stress. Moreover, the use quantity of adhesive can be reduced, and the requirement in adhesion strength can be lowered. Moreover, gaps of the bearing rack provide flow passages for hot air in the heat-radiating component.

To achieve the above objects, the present invention provides a heat-radiating structure of chip disposed around a flip chip type chip on a circuit substrate. The heat-radiating structure of chip comprises a heat-radiating sheet for conducting out beat of the chip and a bearing rack extended from the heat-radiating sheet. The bearing rack is disposed near sides of the heat-radiating sheet facing the surface of the chip. Moreover, an adhesive is connected between the top face of the chip and the surface of the heat-radiating sheet.

The present invention also provides another heat-radiating structure of chip disposed around a flip chip type chip on a circuit substrate. The heat-radiating structure of chip comprises a heat-radiating sheet for conducting out heat of the chip and a bearing rack extended from the heat-radiating sheet. The bearing rack is disposed near sides of the heat-radiating sheet facing the surface of the chip. The bearing rack is divided into at least two parts. Moreover, an adhesive is connected between the top face of the chip and the surface of the heat-radiating sheet.

The present invention also provides another heat-radiating structure of chip disposed around a flip chip type chip on a circuit substrate. The heat-radiating structure of chip comprises a heat-radiating sheet for conducting out heat of the chip and a bearing rack extended from the heat-radiating sheet. The bearing rack is disposed near sides of the heat-radiating sheet facing the surface of the chip. Each side of the bearing rack is divided into at least two parts, and each side of the bearing rack is not connected to one another. Moreover, an adhesive is connected between the top face of the chip and the surface of the heat-radiating sheet.

The various objects and advantages of the present invention will be more readily understood from the following detailed description when read in conjunction with the appended drawing, in which:

DETAILED DESCRIPTION OF THE PREFERRED EMBODIMENTS

Figure 3:
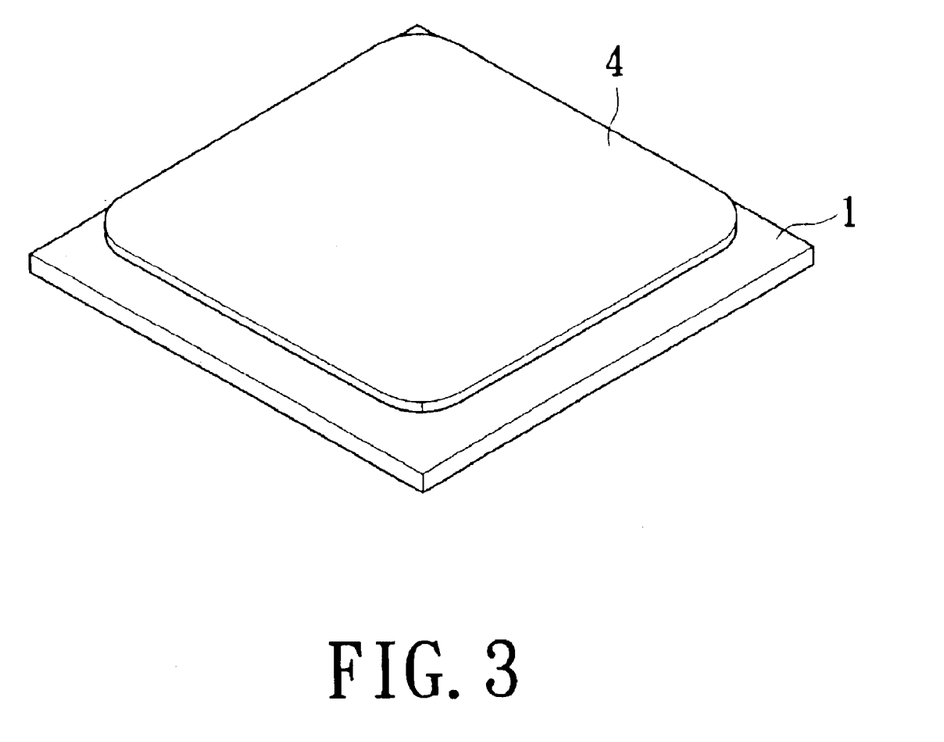
FIG. 3 is a perspective view of the present invention.
Figure 4:
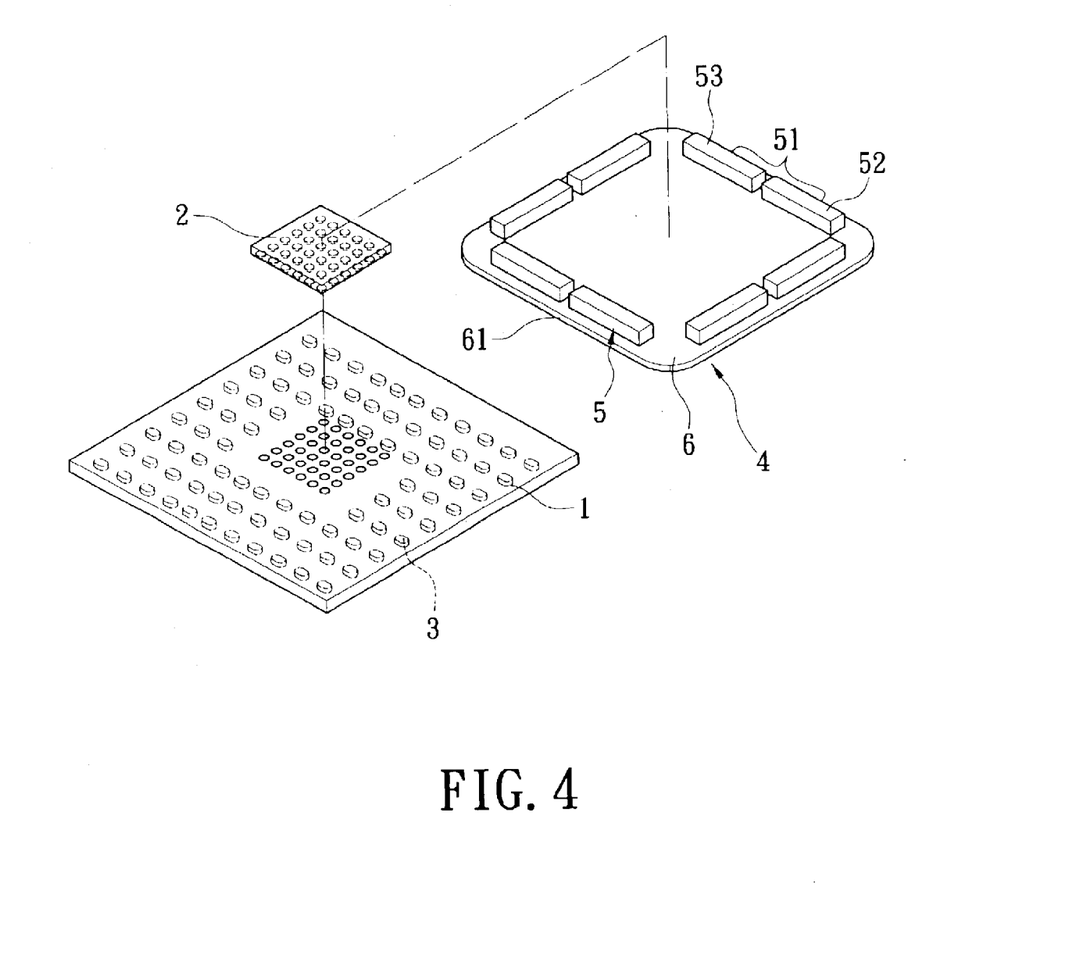
FIG. 4 is an exploded perspective view of a first embodiment of the present invention.
Figure 5:
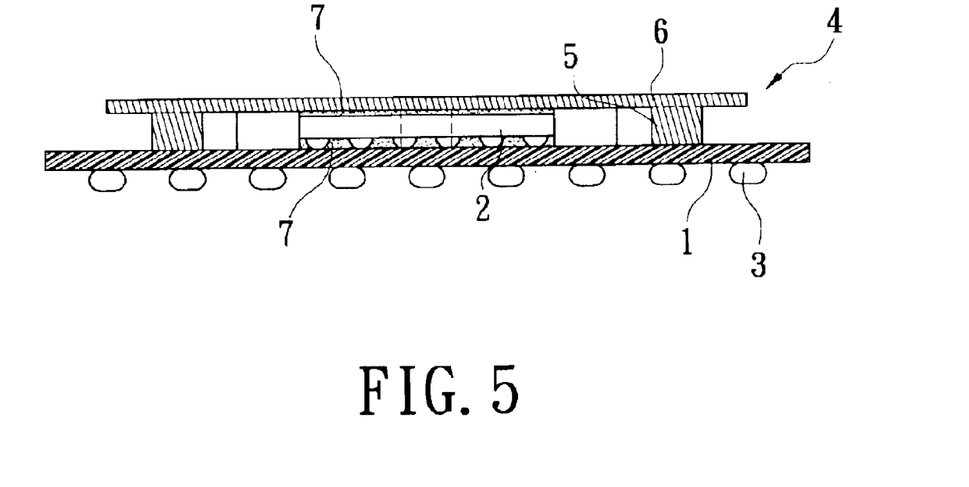
FIG. 5 is a cross-sectional assembly view of the present invention in FIG. 4.

FIGS. 3 to 5 show a first embodiment of the present invention, wherein a flip 10 chip type chip 2 is connected on a circuit substrate 1. The chip 2 can be connected on the circuit substrate 1 for fixation through an adhesive 7. A transmission device 3 of electronic signal is disposed at the bottom of the circuit substrate 1. The transmission device 3 in FIG. 4 is a ball grid array.

A heat-radiating component 4 is connected around the chip 2 on the circuit substrate 1. The heat-radiating component 4 has a bearing rack 5 and a heat-radiating sheet 6. The bottom face of the bearing rack 5 adheres to the surface of the circuit substrate 1 through the adhesive 7. The heat-radiating sheet 6 is connected at the top face of the bearing rack 5. The heat-radiating sheet 6 and the bearing rack 5 are integrally formed, and have a very good heat-conducting proper to provide a good heat-spreading path of heat generated by the chip 2.

The heat-radiating sheet 6 and the bearing rack 5 are integrally formed. That is, the bearing rack 5 is extended from the heat-radiating sheet 6. The bearing rack 5 is of a square ring shape. The bearing rack 5 is disposed near a side 61 of the heat-radiating sheet 6 facing the surface of the chip 2. Each corresponding side 51 of the bearing sheet 6 is divided into at least two lathes 52 and 53. Two adjacent sides 51 of the bearing rack 5 are not connected together at the corner. The adhesive 7 is disposed at the top face of the chip 2 and the surface of the heat-radiating sheet 6 to join them together.

The lathes 52 and 53 of each side 51 of the bearing rack 5 form a separate shape so that hot air can dissipate via gaps 54 between the lathes 52 and 53 (shown in FIG. 4) to have a good mobility of hot air.

Figure 6:
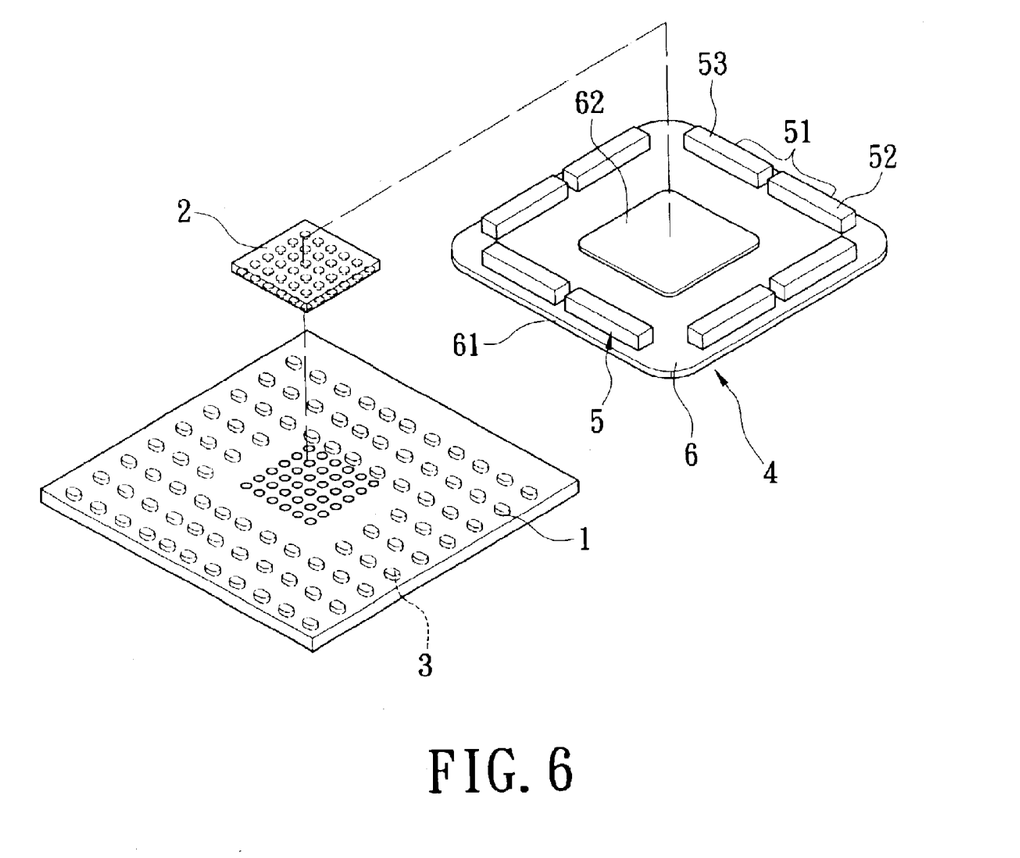
FIG. 6 is an exploded perspective view of a second embodiment of the present invention.
Figure 7:
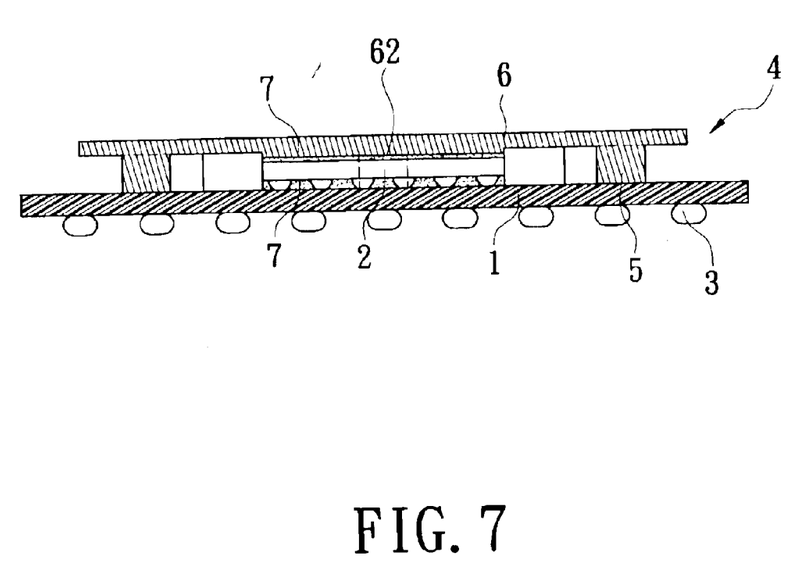
FIG. 7 is a cross-sectional assembly view of the present invention in FIG. 6.

FIGS. 6 and 7 show a second embodiment of the present invention, whose main structure is the same as that of the first embodiment. A projective portion 62 facing the chip 2 is further disposed at the surface of the heat-radiating sheet 6. The surface of the projective portion 62 and the surface of the chip 2 are connected together with the adhesive 7. In addition to easily conducting heat out of the heat-radiating sheet, the stability of the chip 2 is reinforced, and the inner stress of the: chip is lowered.

Figure 8:
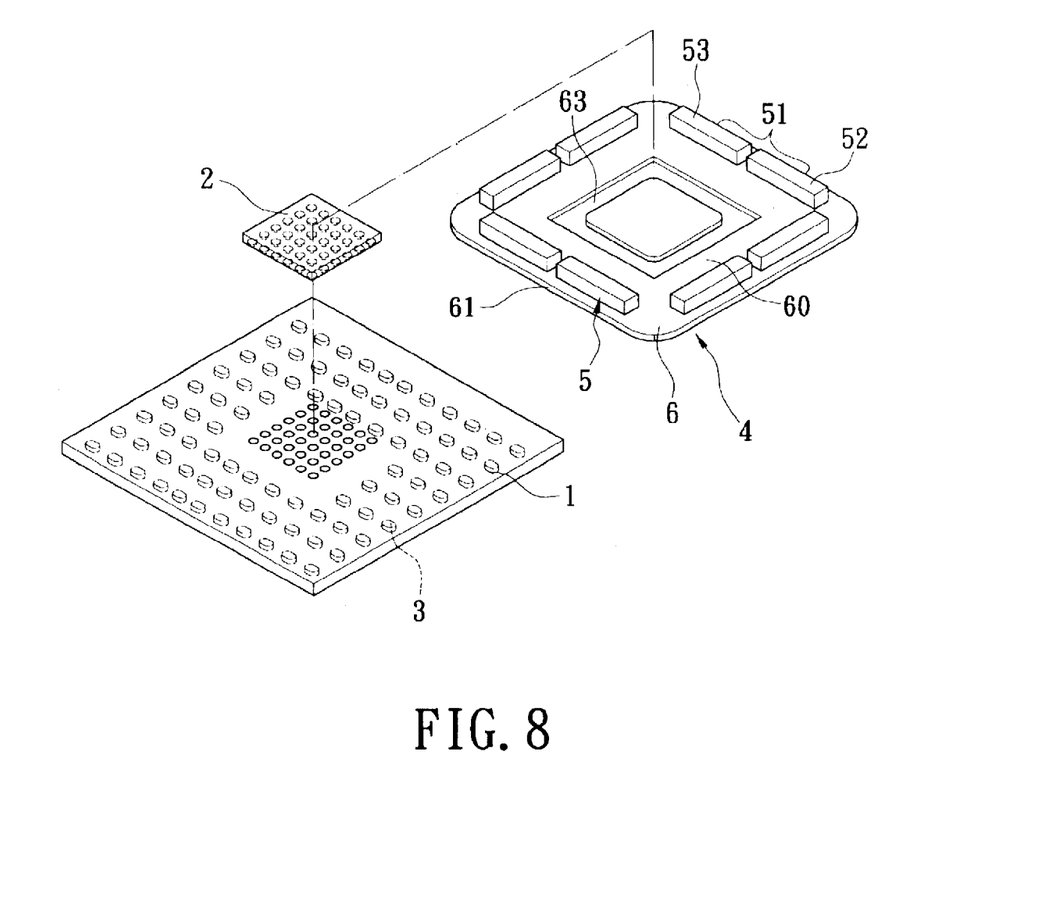
FIG. 8 is an exploded perspective view of a third embodiment of the present invention.
Figure 9:
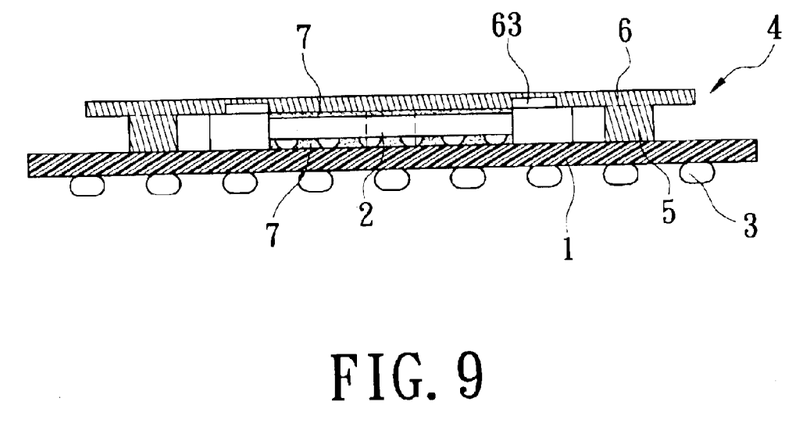
FIG. 9 is a cross-sectional assembly view of the present invention in FIG. 8.

FIGS. 8 and 9 show a third embodiment of the present invention, whose main structure is roughly the same as that of the first embodiment. An annular groove 63 surrounding the chip 2 is further disposed at the surface 60 of the heat-radiating sheet 6 facing the chip 2. The groove 62 can reduce the weight and maintain the structural rigidity of the heat-radiating sheet 6, and can also decrease the degree of deformation of the heat-radiating sheet due to thermal expansion.

Figure 10:
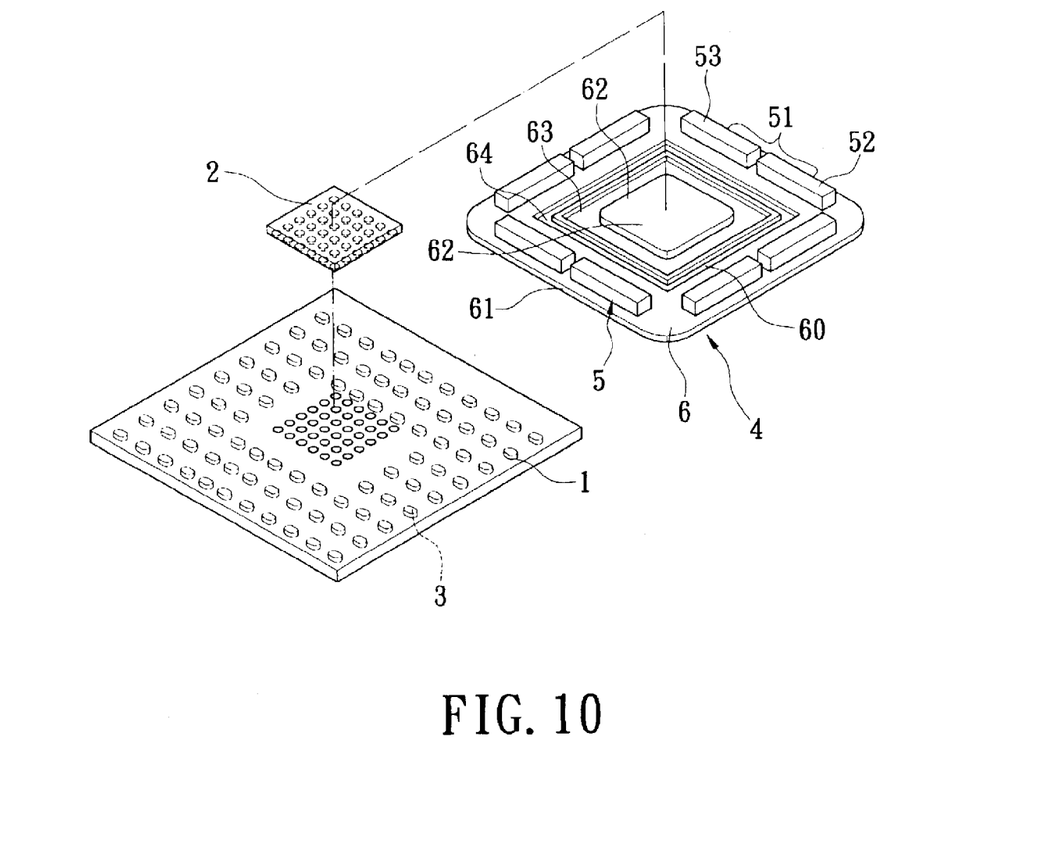
FIG. 10 is an exploded perspective view of a fourth embodiment of the present invention.
Figure 11:
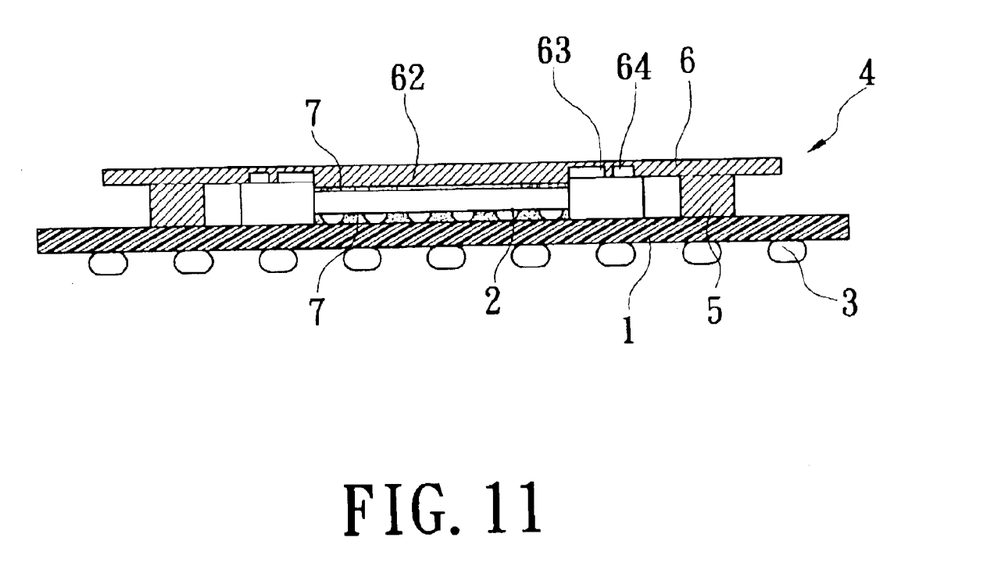
FIG. 11 is a cross-sectional assembly view of the present invention in FIG. 10.

FIGS. 10 and 11 show a fourth embodiment of the present invention, which includes all the characteristics of the first, second and third embodiments. In addition that the heat-radiating sheet 6 is connected with the bearing rack 5, the projective portion 62 and the groove 63 are also provided. An outer groove 64 outside the groove 63 is also provided to simultaneously have all the functions. Moreover, the heat-radiating sheet has a better structure.

Figure 12:
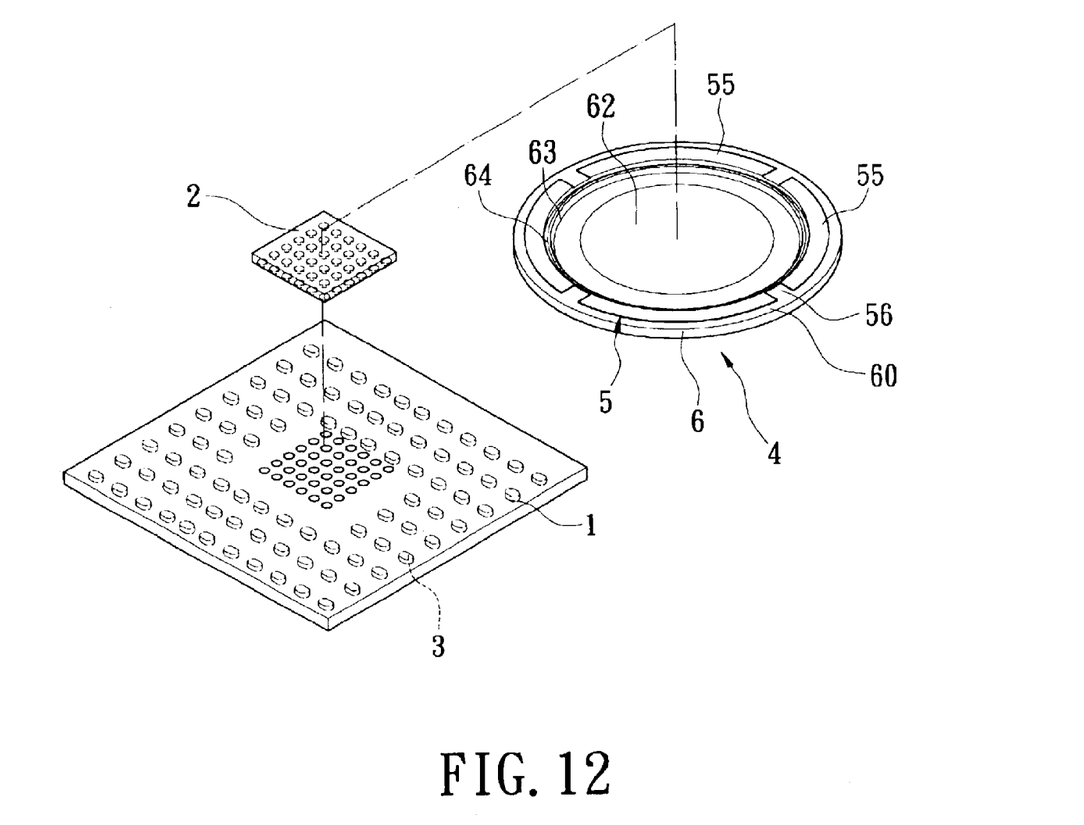
FIG. 12 is an exploded perspective view of a fifth embodiment of the present invention.
Figure 13:
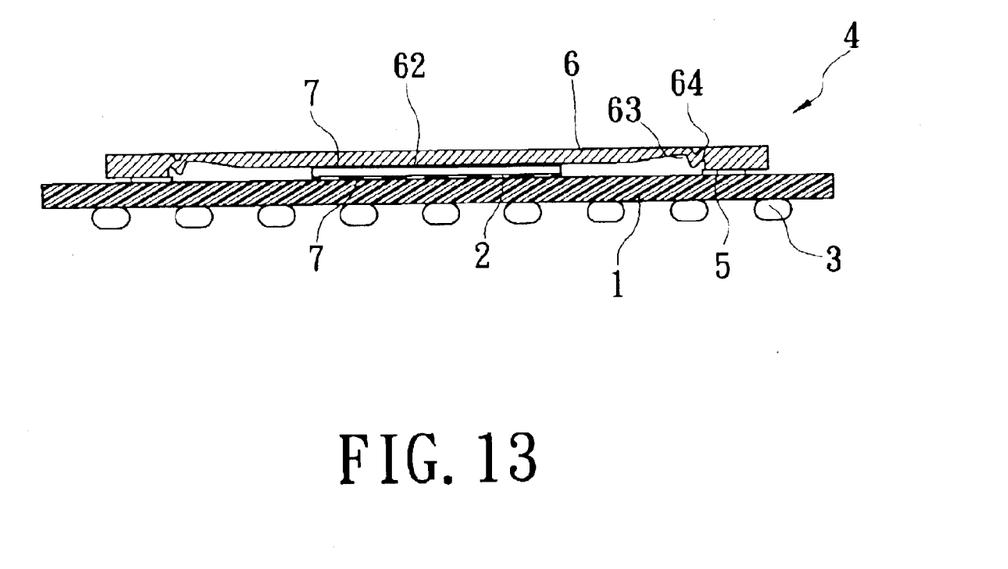
FIG. 13 is a cross-sectional assembly view of the present invention in FIG. 12.

FIGS. 12 and 13 show a fifth embodiment of the present invention, whose main structure is roughly the same as that of the fourth embodiment with only the shape of part of the structure slightly changed. The bearing rack 5 is designed to be of a circular ring shape. The bearing rack 5 in divided into a plurality of lathes 55 with gaps 56 formed between them. A projective portion 62 facing the chip 2 is further disposed at the surface of the heat-radiating sheet 6. The surface of the projective portion 62 and the surface of the chip 2 are connected together with the adhesive 7. An annular groove 63 surrounding the chip 2 is further disposed at the surface 60 of the heat-radiating sheet 6 facing the chip 2. An outer groove 64 outside the groove 63 is also provided. The functions of the projective portion 62, the groove 63 and the outer groove 64 are roughly the same as the above embodiments.

To sum up, the present invention utilizes an intermittent design to form a separately disposed bearing rack. The heat-radiating sheet is also designed to have different embodiments. The lathes of the bearing rack are mainly used to generate a supporting function. Although it is also necessary to use adhesive to adhere the bearing rack to the surface of the circuit substrate, an intermittent shape is formed at the bearing rack to avoid positions with a too large local thermal stress, hence reducing the use quantity of adhesive and lowering the requirement in adhesion strength.

Besides, the gaps between the lathes can provide flow passages for hot air in the heat-radiating component. Moreover, because the heat-radiating component is integrally formed, good structural rigidity and stability can be provided, and thermal stress damage due to thermal deformation can be reduced.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

I claim:

1. A heat-radiating structure of chip disposed around a flip chip type chip on a circuit substrate, comprising:
    a heat-radiating sheet for conducting out heat of said chip; and
    a bearing rack extended from said heat-radiating sheet and disposed near sides of said heat-radiating sheet facing a surface of said chip, an adhesive being connected between a top face of said chip and a surface of said heat-radiating sheet.

2. The heat-radiating structure of chip as claimed in claim 1, wherein at least a groove surrounding said chip is disposed at the surface of said heat-radiating sheet facing said chip.

3. The heat-radiating structure of chip as claimed in claim 1, wherein a projective portion is disposed at the surface of said heat-radiating sheet facing said chip.

4. The heat-radiating structure of chip as claimed in claim 3, wherein said heat-radiating sheet uses a surface of said projective portion to connect a surface of said chip.

5. The heat-radiating structure of chip as claimed in claim 3, wherein at least a groove surrounding said chip is disposed beside said projective portion of said heat-radiating sheet facing the surface of said chip.

6. The heat-radiating structure of chip as claimed in claim 1, wherein said chip and said circuit substrate are connected together with adhesive.

7. The heat-radiating structure of chip as claimed in claim 1, wherein said bearing rack is of a square ring shape.

8. The heat-radiating structure of chip as claimed in claim 1, wherein said bearing rack is of a circular ring shape.

9. A heat-radiating structure of chip disposed around a flip chip type chip on a circuit substrate, comprising:

a heat-radiating sheet for conducting out heat of said chip; and a bearing rack extended from said heat-radiating sheet and disposed near sides of said heat-radiating sheet facing a surface of said chip, said bearing rack being divided into at least two parts, an adhesive being connected between a top face of said chip and a surface of said heat-radiating sheet.

10. The heat-radiating structure of chip as claimed in claim 9, wherein at least a groove surrounding said chip is disposed at the surface of said heat-radiating sheet facing said chip.

11. The heat-radiating structure of chip as claimed in claim 9, wherein a projective portion is disposed at the surface of said heat-radiating sheet facing said chip.

12. The heat-radiating structure of chip as claimed in claim 11, wherein said heat-radiating sheet uses a surface of said projective portion to connect a surface of said chip.

13. The heat-radiating structure of chip as claimed in claim 11, wherein at least a groove surrounding said chip is disposed beside said projective portion of said heat-radiating sheet facing the surface of said chip.

14. The heat-radiating structure of chip as claimed in claim 9, wherein said chip and said circuit substrate are connected together with adhesive.

15. The heat-radiating structure of chip as claimed in claim 9, wherein said bearing rack is of a square ring shape.

16. The heat-radiating structure of chip as claimed in claim 9, wherein said bearing rack is of a circular ring shape.

17. A heat-radiating structure of chip disposed around a flip chip type chip on a circuit substrate, comprising:

a heat-radiating sheet for conducting out heat of said chip; and a bearing rack extended from said heat-radiating sheet and disposed near sides of said heat-radiating sheet facing a surface of said chip, each side of said bearing rack being divided into at least two parts, each side of said bearing rack being not connected together, an adhesive being connected between a top face of said chip and a surface of said heat-radiating sheet.

18. The heat radiating structure of chip as claimed in claim 17, wherein at least a groove surrounding said chip is disposed at the surface of said heat-radiating sheet facing said chip.

19. The heat-radiating structure of chip as claimed in claim 17, wherein a projective portion is disposed at the surface of said heat-radiating sheet facing said chip.

20. The heat-radiating structure of chip as claimed in claim 19, wherein said heat-radiating sheet uses a surface of said projective portion to connect a surface of said chip.

* * * * *